United States Patent
Lee

(10) Patent No.: US 10,866,856 B2
(45) Date of Patent: Dec. 15, 2020

(54) MEMORY SYSTEM AND OPERATING METHOD THEREOF

(71) Applicant: SK hynix Inc., Icheon-si (KR)

(72) Inventor: Jae Yoon Lee, Seoul (KR)

(73) Assignee: SK hynix Inc., Icheon-si (KR)

( * ) Notice: Subject to any disclaimer, the term of this patent is extended or adjusted under 35 U.S.C. 154(b) by 98 days.

(21) Appl. No.: 16/147,202

(22) Filed: Sep. 28, 2018

(65) Prior Publication Data

US 2019/0108092 A1    Apr. 11, 2019

(30) Foreign Application Priority Data

Oct. 11, 2017  (KR) .................. 10-2017-0130123

(51) Int. Cl.
| | |
|---|---|
| G06F 11/00 | (2006.01) |
| G06F 11/10 | (2006.01) |
| G11C 11/56 | (2006.01) |
| G11C 16/28 | (2006.01) |
| G11C 7/00 | (2006.01) |
| G11C 29/52 | (2006.01) |
| G11C 29/04 | (2006.01) |

(52) U.S. Cl.
CPC ...... *G06F 11/1068* (2013.01); *G06F 11/1012* (2013.01); *G11C 11/5642* (2013.01); *G11C 16/28* (2013.01); *G11C 7/00* (2013.01); *G11C 29/52* (2013.01); *G11C 2029/0411* (2013.01)

(58) Field of Classification Search
None
See application file for complete search history.

(56) References Cited

U.S. PATENT DOCUMENTS

| | | | | |
|---|---|---|---|---|
| 2008/0209111 | A1* | 8/2008 | Kang | G11C 11/5642 711/103 |
| 2011/0134692 | A1* | 6/2011 | Sharon | G11C 11/5628 365/185.2 |
| 2012/0147671 | A1* | 6/2012 | Kang | G11C 11/5642 365/185.03 |
| 2013/0286741 | A1* | 10/2013 | Kang | G11C 11/5642 365/185.18 |
| 2016/0202934 | A1 | 7/2016 | Pignatelli et al. | |
| 2018/0137003 | A1* | 5/2018 | Pignatelli | G06F 11/1012 |

OTHER PUBLICATIONS

D. Lee and W. Sung, "Estimation of NAND Flash Memory Threshold Voltage Distribution for Optimum Soft-Decision Error Correction," in IEEE Transactions on Signal Processing, vol. 61, No. 2, pp. 440-449, Jan. 15, 2013, doi: 10.1109/TSP.2012.2222399. (Year: 2013).*

* cited by examiner

*Primary Examiner* — Daniel F. McMahon

(57) ABSTRACT

Designs of nonvolatile memory systems and memory operations that enable allocating reliability values associated with the hard data values from memory cells and performing an error correction operation for the hard data based on the reliability values. One example of a memory system includes a nonvolatile memory device including a plurality of memory cells, and a controller suitable for obtaining hard data by performing a hard read operation based on a hard read voltage for the memory cells, and performing an error correction operation for the hard data based on reliability values.

20 Claims, 13 Drawing Sheets

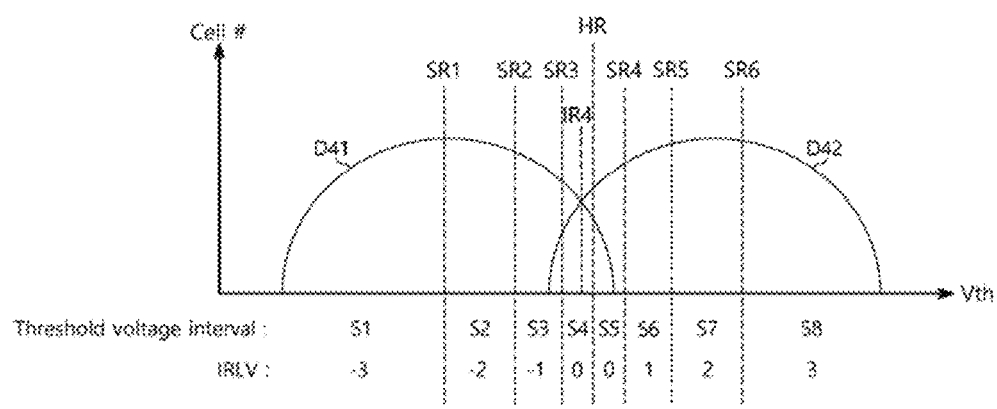
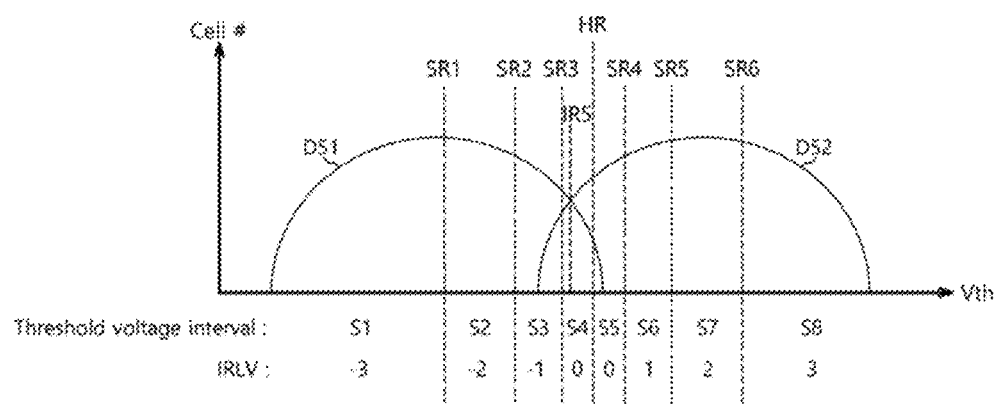

MEMORY SYSTEM AND OPERATING METHOD THEREOF

CROSS-REFERENCES TO RELATED APPLICATION

The present application claims, under 35 U.S.C. § 119(a), the priority to and benefits of the Korean application number 10-2017-0130123, filed on Oct. 11, 2017, which is incorporated herein by reference in its entirety.

TECHNICAL FIELD

The technology disclosed and various embodiments generally relate to a memory system, and, more particularly, to a memory system including a nonvolatile memory device.

BACKGROUND

Memory systems store data provided by an external device in response to a write request. Memory systems may also provide stored data to an external device in response to a read request. Examples of external devices that use memory systems include computers, digital cameras, cellular phones and the like. Memory systems may be embedded in an external device during manufacturing of the external devices or may be fabricated separately and then connected afterwards to an external device.

SUMMARY

This patent document provides designs of nonvolatile memory systems and memory operations that enable allocating reliability values associated with the hard data values from memory cells and performing an error correction operation for the hard data based on the reliability values.

In an embodiment, a memory system may include a nonvolatile memory device including a plurality of memory cells, and operable to apply a read voltage to the memory cells to read data in a read operation, and a controller in communication with the nonvolatile memory device to control operations of the memory cells. The controller is configured to: obtain hard data by performing a hard read operation based on a hard read voltage applied to the memory cells; obtain oversampling data from the memory cells by performing an oversampling read operation based on first and second oversampling read voltages applied to the memory cells; estimate a deviation direction of the hard read voltage based on the hard data and the oversampling data; allocate the reliability values to a plurality of threshold voltage intervals based on the deviation direction; and perform an error correction operation for the hard data based on the reliability values.

In another embodiment, a memory system may include: a nonvolatile memory device including a plurality of memory cells, and suitable for reading data by applying a read voltage to the memory cells in a read operation; and a controller suitable for obtaining hard data by performing a hard read operation based on a hard read voltage for the memory cells, and performing an error correction operation for the hard data based on reliability values, the controller including an estimation unit suitable for obtaining oversampling data by performing an oversampling read operation based on first and second oversampling read voltages for the memory cells, and estimating a deviation direction of the hard read voltage based on the hard data and the oversampling data; and a reliability value allocation unit suitable for allocating the reliability values to a plurality of threshold voltage intervals based on the deviation direction.

In another embodiment, a method for operating a memory system may include: obtaining hard data by performing a hard read operation based on a hard read voltage for memory cells; obtaining oversampling data by performing an oversampling read operation based on first and second oversampling read voltages for the memory cells; estimating a deviation direction of the hard read voltage based on the hard data and the oversampling data; allocating reliability values to a plurality of threshold voltage intervals based on the deviation direction; and performing an error correction operation for the hard data based on the reliability values.

In another embodiment, a memory system can include a nonvolatile memory device including a plurality of memory cells, and operable to apply a read voltage to the memory cells to read data in a read operation; and a controller in communication with the nonvolatile memory device to control operations of the memory cells. The controller is configured to obtain hard data by performing a hard read operation based on a hard read voltage applied to the memory cells; obtain oversampling data from the memory cells by performing an oversampling read operation based on first and second oversampling read voltages applied to the memory cells; estimate a deviation direction of the hard read voltage with respect to a reference voltage based on threshold voltage distributions of the memory cells by processing the hard data and the oversampling data; allocate the reliability values to a plurality of threshold voltage intervals based on the deviation direction; and perform an error correction operation for the hard data based on the reliability values.

In another embodiment, a method is provided for operating a memory system to include obtaining hard data from memory cells by performing a hard read operation based on a hard read voltage applied to the memory cells; estimating a deviation direction of the hard read voltage with respect to a reference voltage based on threshold voltage distributions of the memory cells by processing the hard data and oversampling data obtained from the memory cells; allocating reliability values to a plurality of threshold voltage intervals based on the deviation direction; and performing an error correction operation for the hard data based on the reliability values.

In yet another embodiment, a memory system can be constructed to perform error correction on the hard data based on the reliability values obtained from hard data and oversampling data. Such a system can include one or more memory devices including a plurality of memory cells, and operable to apply a hard read voltage to the memory cells to read data based on comparison with threshold voltage distributions of the memory cells; a controller in communication with the one or more memory devices to control operations performed on the memory cells; and memory for storing one or more instructions configured to be executed by the controller. The instruction stored on the memory include instructions for performing a soft read operation on the memory cells based on a plurality of soft read voltages that subdivides the threshold voltage distributions into a plurality of threshold voltage intervals; instructions for allocating an initial reliability value to each threshold voltage interval based on data read out in the soft read operation; instructions for performing an oversampling read operation on the memory cells based on oversampling read voltages; instructions for counting a number of memory cells of which the threshold voltages exist between the hard read voltage and oversampling read voltages and comparing each counting result; instructions for adjusting the initial reliability value by estimating a current threshold voltage distribution based on the comparing result; and instructions for performing a soft decision decoding operation based on the adjusted reliability value.

The above and other embodiments and implementations of the disclosed technology are described in greater detail in the drawings, the description and the claims.

BRIEF DESCRIPTION OF THE DRAWINGS

Certain features and advantages of the disclosed technology are illustrated by various embodiments thereof with reference to the attached drawings in which

FIG. 4 is a representation of a diagram to assist in the explanation of an example of an error correction operation for the data read from a nonvolatile memory device in accordance with the embodiment.

FIG. 5 is a diagram illustrating a representation of an example of initial reliability values for other threshold voltage distributions.

DETAILED DESCRIPTION

Figure 1:
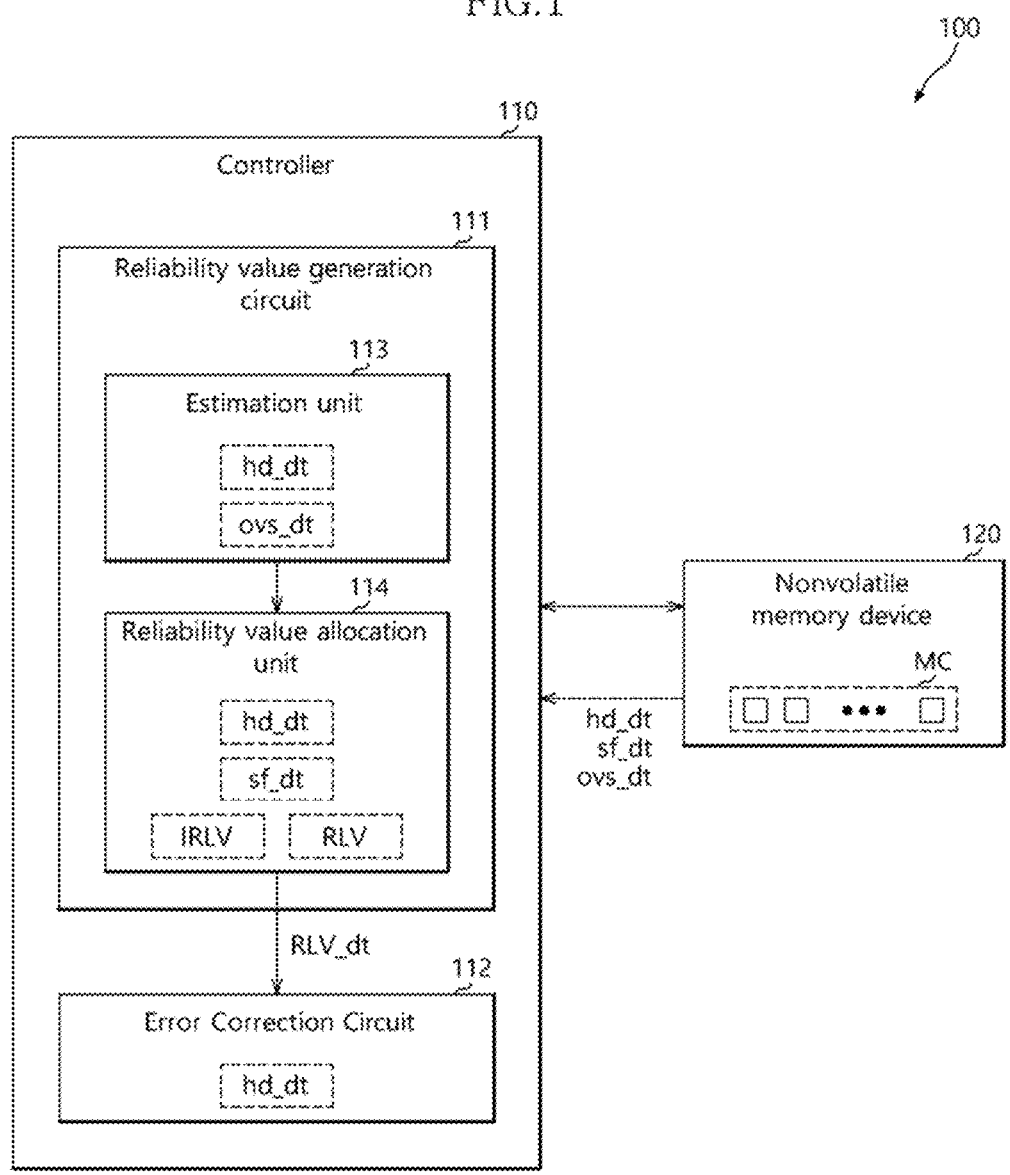
FIG. 1 is a block diagram illustrating a representation of an example of a memory system in accordance with an embodiment.

Hereinafter, features of the technology disclosed in this patent document are described by examples of a memory system and an operating method thereof with reference to the accompanying drawings.

It is to be understood that the disclosed technology can be implemented in various ways beyond the specifics of the examples described herein and thus are not limited to the particulars shown in the drawings, that the drawings are not necessarily to scale, and, in some instances, proportions may have been exaggerated in order to more clearly depict certain features of the illustrated examples. While particular terminology is used, it is to be appreciated that the terminology used is for describing particular embodiments only and is not intended to limit the implementations of the disclosed technology.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of only two of A, B, or C without having the third element, or a combination of A, B and C.

The term "or" as used herein means either one of two or more alternatives but not both nor any combinations thereof.

As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements.

FIG. 1 is a block diagram illustrating a representation of an example of a memory system 100 in accordance with an embodiment.

The memory system 100 may be configured and operable to store the data provided from an external device by a data writing operation in response to a write request from the external device. Also, the memory system 100 may be configured and operable to provide stored data to the external device by a data read operation in response to a read request from the external device.

The memory system 100 may be configured in various forms or formats, e.g., a Personal Computer Memory Card International Association (PCMCIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD) or others.

The memory system 100 in FIG. 1 may include a controller 110 and a nonvolatile memory device 120.

The controller 110 may control general operations of the memory system 100. The controller 110 may control the nonvolatile memory device 120 to store data in the nonvolatile memory device 120 in response to a write request transmitted from the external device, and may read data stored in the nonvolatile memory device 120 and output read data to the external device in response to a read request transmitted from the external device.

The controller 110 may include a reliability value generation circuit 111 and an error correction circuit 112.

The reliability value generation circuit 111 may generate reliability data RLV_dt by allocating reliability values RLV to the respective bits of hard data hd_dt that is read from memory cells MC of the nonvolatile memory device 120. Each of the bits of the reliability data RLV_dt may represent the reliability of a corresponding bit of the hard data hd_dt, and may be used when the error correction circuit 112 performs an error correction operation for the hard data hd_dt.

The hard data hd_dt may be read from the memory cells MC through a hard read operation based on a hard read voltage to represent the data stored in the memory cells MC through a write operation. The hard data hd_dt may be read as "0" or "1" for a memory cell, depending on whether the threshold voltage of the corresponding memory cell is larger or smaller than the hard read voltage.

According to the present embodiment, the reliability value generation circuit 111 may not use the reliability values stored previously as is, such as initial reliability values IRLV, and may adjust the initial reliability values IRLV to produce the reliability values RLV by estimating the deviation direction and the deviation degree of the hard read voltage.

The reliability value generation circuit 111 may include an estimation unit 113 and a reliability value allocation unit 114 that are coupled to be in communication with each other.

The estimation unit 113 may estimate the deviation direction and the deviation degree of the hard read voltage based on the hard data hd_dt and oversampling data ovs_dt. The deviation direction of the hard read voltage may indicate whether the hard read voltage is larger or smaller than an ideal read voltage. The deviation degree of the hard read voltage may indicate the absolute difference between the ideal read voltage and the hard read voltage.

The oversampling data ovs_dt may be the data read from the memory cells MC by using first and second oversampling read voltages. The first oversampling read voltage may be smaller than the hard read voltage by a predetermined offset value, and the second oversampling read voltage may be larger than the hard read voltage by the predetermined offset value. The oversampling data ovs_dt may be obtained as a first value, for example, "0," from a memory cell which has a threshold voltage larger than the first oversampling read voltage and smaller than the second oversampling read voltage. The oversampling data ovs_dt may be obtained as a second value, for example, "1," from a memory cell which has a threshold voltage smaller than the first oversampling read voltage or larger than the second oversampling read voltage.

Therefore, the estimation unit 113 may compare the threshold voltage of a memory cell with the first and second oversampling read voltages based on the oversampling data ovs_dt. Also, the estimation unit 113 may compare the threshold voltage of a memory cell with the hard read voltage based on the hard data hd_dt.

Accordingly, the estimation unit 113 may count memory cells which have threshold voltages larger than the first oversampling read voltage and smaller than the hard read voltage, based on the hard data hd_dt and the oversampling data ovs_dt, and may generate a counted result as a first estimation value. Further, the estimation unit 113 may count memory cells which have threshold voltages larger than the hard read voltage and smaller than the second oversampling read voltage, based on the hard data hd_dt and the oversampling data ovs_dt, and may generate a counted result as a second estimation value. The estimation unit 113 may estimate the deviation direction and the deviation degree of the hard read voltage by comparing the first estimation value and the second estimation value.

More specifically, when the first estimation value is smaller than the second estimation value, the estimation unit 113 may estimate or determine that the deviation direction of the hard read voltage is positive, that is, the hard read voltage is larger than an ideal read voltage. When the first estimation value is larger than the second estimation value, the estimation unit 113 may estimate or determine that the deviation direction of the hard read voltage is negative, that is, the hard read voltage is smaller than the ideal read voltage.

While the comparison between the first and second estimation values indicate the deviation direction of the hard read voltage, the absolute value of the difference between the first and second estimation values is used by the estimation unit 113 to estimate or determine the deviation degree of the hard read voltage. As the absolute value or magnitude of the difference of the first and second estimation values is large, the estimation unit 113 may estimate that the deviation degree of the hard read voltage is large. For example, when the absolute value of the difference of the first and second estimation values is larger than a reference value, the estimation unit 113 may estimate that the deviation degree of the hard read voltage is large. When the absolute value of the difference of the first and second estimation values is smaller than the reference value, the estimation unit 113 may estimate that the deviation degree of the hard read voltage is small.

According to an embodiment, the estimation unit 113 may determine the deviation degree of the hard read voltage not by dividing it into two states as being large or small but by subdividing it through using a plurality of reference values.

The reliability value allocation unit 114 may generate the reliability data RLV_dt by allocating the reliability values RLV to the hard data hd_dt based on the deviation direction and the deviation degree of the hard read voltage estimated by the estimation unit 113.

For example, the reliability value allocation unit 114 may allocate the reliability values RLV to a plurality of threshold voltage intervals, respectively. The reliability value allocation unit 114 may allocate the reliability values RLV to the hard data hd_dt by allocating a corresponding reliability value to the memory cells positioned in each of the threshold voltage intervals. As such, a reliability value allocated to a certain memory cell may be allocated in the same manner to the hard data read from the corresponding memory cell.

The plurality of threshold voltage intervals may be intervals that are divided by the hard read voltage and soft read voltages. The soft read voltages may be used to read soft data sf_dt from the memory cells MC in a soft read operation. The soft data sf_dt may be read according to whether the threshold voltages of memory cells are larger or smaller than the soft read voltages. Therefore, the reliability value allocation unit 114 may determine memory cells which are positioned in the respective threshold voltage intervals, based on the hard data hd_dt representing the data state of each memory cell and associated soft data sf_dt indicating the quality or confidence of the hard data hd_dt of each memory cell.

The reliability value allocation unit 114 may generate the reliability values RLV by adjusting the initial reliability values IRLV by an adjustment value based on the deviation direction of the hard read voltage. In detail, the reliability value allocation unit 114 may adjust the initial reliability values IRLV by a positive adjustment value when the deviation direction of the hard read voltage is positive. The reliability value allocation unit 114 may adjust the initial reliability values IRLV by a negative adjustment value when the deviation direction of the hard read voltage is negative.

In some implementations, the magnitudes of the reliability values RLV may be limited to a predetermined maximum value.

Specifically, the reliability value allocation unit 114 may generate the reliability values RLV by adjusting the initial reliability values IRLV by one or more adjustment values by further including information from the deviation degree of the hard read voltage. In this regard, one example of different ways to achieve this is to operate the reliability value allocation unit 114 to generate the reliability values RLV by adjusting the initial reliability values IRLV by nonuniform adjustment values when the deviation degree of the hard read voltage is large. The sign of the adjustment values may be determined by the deviation direction of the hard read voltage.

One specific example is provided below. The reliability value allocation unit 114 may adjust initial reliability values IRLV corresponding to some threshold voltage intervals by a first adjustment value, and may adjust initial reliability values IRLV corresponding to the remaining threshold voltage intervals by a second adjustment value. The boundary between some threshold voltage intervals to which the first adjustment value is applied and the remaining threshold voltage intervals to which the second adjustment value is applied may be positioned in a direction opposite to the deviation direction of the hard read voltage based on the hard read voltage. The magnitude of the first adjustment value may be larger than the magnitude of the second adjustment value.

In addition, the reliability value allocation unit 114 may generate the reliability values RLV by adjusting the initial reliability values IRLV by a single adjustment value, for example, "1," when the deviation degree of the hard read voltage is small.

According to an embodiment, the reliability value generation circuit 111 may refer to only the deviation direction of the hard read voltage to adjust the initial reliability values IRLV.

The error correction circuit 112 may perform the error correction operation based on the reliability data RLV_dt generated by the reliability value generation circuit 111, for the hard data hd_dt read from the nonvolatile memory device 120. In implementations, the error correction operation may be a soft decision decoding operation.

In operation, the nonvolatile memory device 120 may store the data transmitted from the controller 110 and may read out stored data and transmit the read-out data to the controller 110, according to the control of the controller 110. The nonvolatile memory device 120 may include the memory cells MC which store data. Various implementations are possible. For example, the memory cells MC may be, in some implementations, a structure capable of being read-accessed simultaneously. In this example, the memory cells MC may be coupled to the same word line so that the nonvolatile memory device 120 may read data simultaneously from the memory cells MC by applying various read voltages to the word line coupled to the memory cells MC.

The nonvolatile memory device 120 may support and may be structured to perform an oversampling read operation. When the oversampling read operation is performed, the nonvolatile memory device 120 may obtain the oversampling data ovs_dt by applying the first and second oversampling read voltages provided from the controller 110, to the memory cells MC, and may transmit the oversampling data ovs_dt to the controller 110.

In some implementations, the nonvolatile memory device 120 may obtain 1 bit from each of the memory cells MC as the oversampling data ovs_dt. The nonvolatile memory device 120 may obtain a first value, e.g., "0," as the oversampling data ovs_dt, from a memory cell which has a threshold voltage larger than the first oversampling read voltage and smaller than the second oversampling read voltage. The nonvolatile memory device 120 may obtain a second value, e.g., "1," as the oversampling data ovs_dt, from a memory cell which has a threshold voltage smaller than the first oversampling read voltage or larger than the second oversampling read voltage.

The nonvolatile memory device 120 may be implemented in various configurations, including, e.g., a flash memory, such as a NAND flash or a NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), or others.

While it is illustrated in FIG. 1 that the memory system 100 includes one nonvolatile memory device 120, it is to be noted that the number of nonvolatile memory devices included in the memory system 100 is not limited thereto in implementations and may include two or more nonvolatile memory devices 120 depending on the needs of specific applications.

Figure 2:
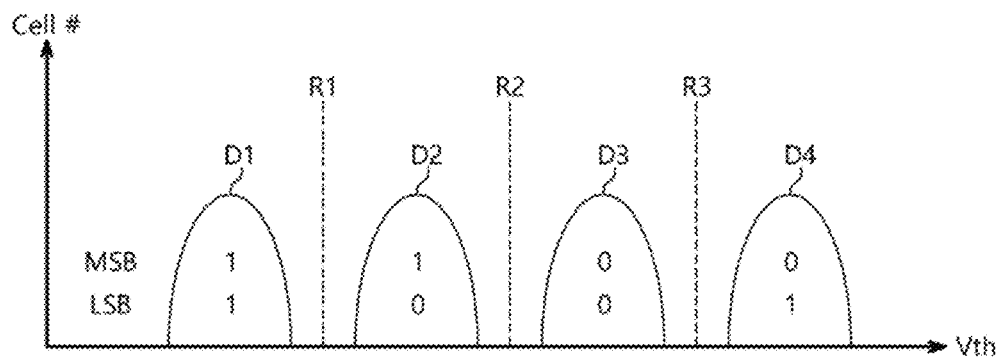
FIG. 2 is a diagram illustrating a representation of an example of threshold voltage distributions of the memory cells of FIG. 1.

FIG. 2 is a diagram illustrating a representation of an example of threshold voltage distributions D1 to D4 of the memory cells MC of FIG. 1. The horizontal axis Vth represents the threshold voltage of a memory cell, and the vertical axis Cell # represents the number of memory cells MC corresponding to a threshold voltage.

Referring to the example in FIG. 2, the memory cells MC may form the predetermined threshold voltage distributions D1 to D4 according to the data stored therein. Each memory cell may be controlled to have a threshold voltage corresponding to any one among the four threshold voltage distributions D1 to D4, depending on 2-bit data to be stored therein. For example, a memory cell stored with data "11" may have a threshold voltage corresponding to the threshold voltage distribution D1. A memory cell stored with data "10" may have a threshold voltage corresponding to the threshold voltage distribution D2. A memory cell stored with data "00" may have a threshold voltage corresponding to the threshold voltage distribution D3. A memory cell stored with data "01" may have a threshold voltage corresponding to the threshold voltage distribution D4. In FIG. 2, the reference symbol "MSB" means a most significant bit, and the reference symbol "LSB" means a least significant bit. When 2 bits are stored in each memory cell, each memory cell may correspond to two pages, that is, an LSB page in which an LSB is stored and an MSB page in which an MSB is stored.

In implementing the disclosed technology, the number of bits to be stored in each memory cell is not limited to, and can be other than, 2 bits as shown in the example in FIG. 2. When i bits are stored in each memory cell, memory cells may form 2i number of threshold voltage distributions. When i bits are stored in each memory cell, each memory cell may correspond to i number of pages.

In operation, each memory cell may be turned on or off depending on the threshold voltage thereof, when it is applied with a predetermined read voltage through a word line. For example, each memory cell may be turned on when it is applied with a read voltage larger than its threshold voltage, and may be turned off when it is applied with a read voltage smaller than its threshold voltage.

The nonvolatile memory device 120 may determine whether the threshold voltage of the memory cell is larger or smaller than the read voltage, by sensing the current formed when the memory cell is turned on or off. Therefore, by applying read voltages R1 to R3 positioned between the threshold voltage distributions D1 to D4 to memory cells, the nonvolatile memory device 120 may determine whether the threshold voltages of the memory cells are larger or smaller than the respective read voltages R1 to R3. In other words, the nonvolatile memory device 120 may determine threshold voltage distributions where the memory cells are positioned, by using the read voltages R1 to R3, and resultantly, may read the data stored in the memory cells.

For example, by applying the read voltages R1 to R3 to a certain memory cell and sensing the current formed by the memory cell which is turned on or off, the nonvolatile memory device 120 may determine that the threshold voltage of the corresponding memory cell is larger than the read voltage R2 and smaller than the read voltage R3. Accordingly, the nonvolatile memory device 120 may determine that the corresponding memory cell is positioned in the threshold voltage distribution D3, and may read the data stored in the memory cell as "00."

As shown in FIG. 2, in the case where the threshold voltage distributions D1 to D4 are clearly identified by the read voltages R1 to R3, the data read from memory cells by using the read voltages R1 to R3 may not include error bits. Thus, the nonvolatile memory device 120 may perform first a write operation such that memory cells form the threshold voltage distributions D1 to D4, and may perform then a read operation by using the read voltages R1 to R3 under the expectation that the memory cells form the threshold voltage distributions D1 to D4. However, as described below, the threshold voltage distributions D1 to D4 may move or change, and as a result, may not be clearly identified by the predetermined read voltages R1 to R3.

Figure 3:
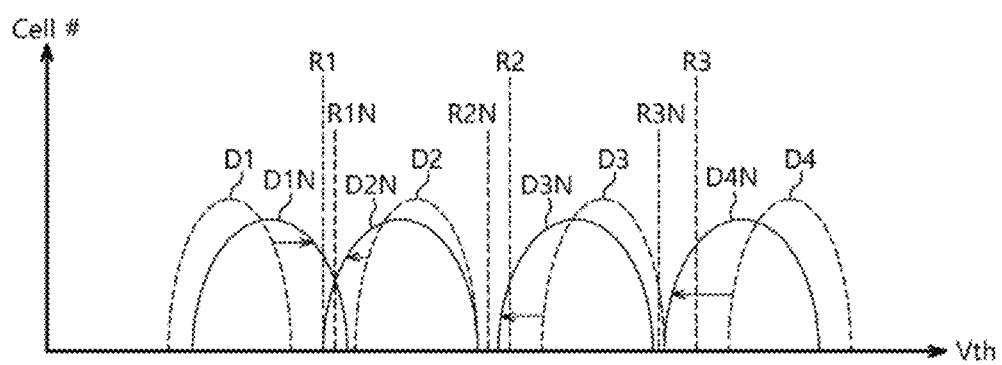
FIG. 3 is a representation of a diagram to assist in the explanation of an example of a method for adjusting read voltages when threshold voltage distributions move, in accordance with the embodiment.

FIG. 3 is a representation of a diagram to assist in the explanation of an example of a method for adjusting the read voltages R1 to R3 when the threshold voltage distributions D1 to D4 move or change, in accordance with the embodiment.

Referring to FIG. 3, the threshold voltage distributions D1 to D4 may move to threshold voltage distributions D1N to D4N and overlap with one another with the lapse of time or by various reasons. In this case, the predetermined read voltages R1 to R3 should be adjusted to read voltages R1N to R3N to be positioned between the moved threshold voltage distributions D1N to D4N. The adjustment of the read voltages R1 to R3 to the read voltages R1N to R3N may be performed by various techniques, including various methods disclosed in the art, detailed descriptions of which are omitted herein.

However, since actual threshold voltage distributions may not have smooth outlines as shown in FIGS. 2 and 3, it may be difficult to adjust the read voltages R1 to R3 to the read voltages R1N to R3N to be precisely positioned between the threshold voltage distributions D1N to D4N. Moreover, if the threshold voltage distributions D1N to D4N overlap as in the threshold voltage distributions D1N and D2N, a read operation for an overlapped portion may induce error bits. Therefore, as described below, the error correction circuit 112 may perform the error correction operation for the data read from the nonvolatile memory device 120 based on the predetermined read voltages R1 to R3 or the adjusted read voltages R1N to R3N.

FIG. 4 is a representation of a diagram to assist in the explanation of an example of an error correction operation for the data read from the nonvolatile memory device 120 in accordance with the embodiment. Threshold voltage distributions D41 and D42 shown in FIG. 4 may be any two adjacent threshold voltage distributions among the threshold voltage distributions MN to D4N of FIG. 3.

Referring to FIG. 4, a hard read voltage HR may be a read voltage which is intended to be positioned at a valley formed by or between the threshold voltage distributions D41 and D42. For example, the hard read voltage HR may be a read voltage which is preset in the nonvolatile memory device 120. For example, the hard read voltage HR may be a read voltage which is adjusted from a read voltage preset in the nonvolatile memory device 120 to be positioned at the valley between the threshold voltage distributions D41 and D42.

The hard read voltage HR may not precisely match a read voltage precisely positioned at the valley between the threshold voltage distributions D41 and D42. In FIG. 4, the voltage for the valley between the threshold voltage distributions D41 and D42 is marked by voltage IR4 which is labeled as "ideal read voltage". This may be because of, as described above, for example, the movement of the threshold voltage distributions D41 and D42 or difficulty in finding the voltage IR4. The voltage IR4 may be a voltage that can minimize error bits in a read operation if it is used as a read voltage. Accordingly, this voltage IR4 for the valley between the threshold voltage distributions D41 and D42 can be a reference voltage based on threshold voltage distributions of the memory cells in the error correction operation.

The data read from the memory cells MC by applying the hard read voltage HR to the memory cells MC may be the above-described hard data hd_dt. The error correction circuit 112 may perform the error correction operation for the hard data hd_dt. The error correction circuit 112 may perform the error correction operation in a soft decision decoding scheme based on an additional information on the reliability of the hard data hd_dt and initial reliability values IRLV.

A soft decision decoding operation may be performed by additionally using soft read voltages SR1 to SR6. The soft read voltages SR1 to SR6 may be determined as voltages which are smaller or larger by predetermined offset values than the hard read voltage HR. While FIG. 4 shows the six soft read voltages SR1 to SR6, it is to be noted that the number of soft read voltages is not limited thereto.

Certain details of the soft decision decoding operation are described below. Similar to a read operation based on the hard read voltage HR, the controller 110 may read data, such as the soft data sf_dt, from the memory cells MC based on the soft read voltages SR1 to SR6. The reliability value generation circuit 111 may determine, based on the soft data sf_dt, where the respective memory cells MC are positioned among threshold voltage intervals S1 to S8 divided by the hard read voltage HR and the soft read voltages SR1 to SR6. For example, the reliability value generation circuit 111 may determine, based on the soft data sf_dt, that the threshold voltage of a certain memory cell is larger than the soft read voltage SR1 and smaller than the soft read voltage SR2. In this case, the reliability value generation circuit 111 may determine that the corresponding memory cell is positioned in the threshold voltage interval S2.

The threshold voltage intervals S1 to S8 may correspond to preset reliability values as shown, that is, initial reliability values IRLV, respectively. The reliability value generation circuit 111 may already store the initial reliability values IRLV corresponding to the threshold voltage intervals S1 to S8, respectively. Therefore, the reliability value generation circuit 111 may determine a reliability value to be allocated to a memory cell or the hard data hd_dt read from the corresponding memory cell, according to a threshold voltage interval where the corresponding memory cell is positioned. The error correction circuit 112 may perform the soft decision decoding operation based on the initial reliability values IRLV allocated to the hard data hd_dt.

When observing the characteristic of a reliability value, the magnitude or absolute value of a reliability value may indicate the reliability of corresponding hard data hd_dt. A large magnitude of a reliability value may indicate that the reliability of corresponding hard data hd_dt, that is, the probability of the corresponding hard data hd_dt not to be an error bit, is large. The sign of a reliability value may be determined as negative or positive depending on the probabilities of corresponding hard data hd_dt to be "0" and "1." A reliability value may include, for example, a log likelihood ratio.

In implementations, the soft decision decoding operation may be deemed successful only when the initial reliability values IRLV are appropriately allocated to the hard data hd_dt. For example, because the threshold voltage intervals S4 and S5 where the threshold voltage distributions D41 and D42 overlap substantially may induce a plurality of error bits, the threshold voltage intervals S4 and S5 may correspond to an initial reliability value IRLV of a small magnitude, for example, "0." The threshold voltage intervals S1 to S8 may be set to correspond to a reliability value of a small magnitude as they are close to the hard read voltage HR and correspond to a reliability value of a large magnitude as they are distant from the hard read voltage HR. Such initial reliability values IRLV may be based on the expectation that the hard read voltage HR will not deviate substantially from the voltage IR4.

FIG. 5 is a diagram illustrating a representation of an example of initial reliability values IRLV for other threshold voltage distributions D51 and D52. FIG. 5 shows a situation in which a hard read voltage HR deviates substantially from the valley between the threshold voltage distributions D51 and D52 marked by a voltage IR5 and thus the initial reliability values IRLV become inappropriate.

Referring to FIG. 5, as described above, because it may be practically difficult to adjust the hard read voltage HR to be positioned at the valley formed by or between the threshold voltage distributions D51 and D52, the hard read voltage HR may deviate substantially from the voltage of the valley as marked by the voltage IR5.

As a result, when the hard read voltage HR deviates substantially from the voltage IR5 for the valley between the threshold voltage distributions D51 and D52, the initial reliability values IRLV corresponding to threshold voltage intervals S1 to S8 may be inappropriate. For example, the initial reliability value IRLV, that is, "0," corresponding to the threshold voltage interval S5 may be inappropriate when considering that the probability of an error bit to occur in the threshold voltage interval S5 is lower than the threshold voltage interval S3.

Accordingly, when the hard read voltage HR deviates substantially from the voltage IR5 for the valley between the threshold voltage distributions D51 and D52, determining soft read voltages SR1 to SR6 and the threshold voltage intervals S1 to S8 based on the hard read voltage HR and automatically allocating the previously stored initial reliability values IRLV may not properly reflect the reliability of hard data hd_dt. Therefore, a soft decision decoding operation based on the inappropriate initial reliability values IRLV may fail.

As described below, the disclosed technology addresses the above technical issues associated with a direction and a degree in and to which a hard read voltage HR deviates from the voltage at the valley between the threshold voltage distributions D51 and D52 by using an oversampling read operation to estimate the direction and the degree of the deviation of the hard read voltage HR, and appropriate reliability values may be allocated to the threshold voltage intervals S1 to S8 based on the estimation. Accordingly, the performance of a soft decision decoding operation may be improved.

A soft decision decoding operation including reliability value adjustment according to the disclosed technology may be performed after a soft decision decoding operation based on initial reliability values IRLV for threshold voltage intervals S1 to S8 fails. According to an embodiment, a soft decision decoding operation including reliability value adjustment may be performed instead of a soft decision decoding operation based on initial reliability values IRLV.

Figure 6:
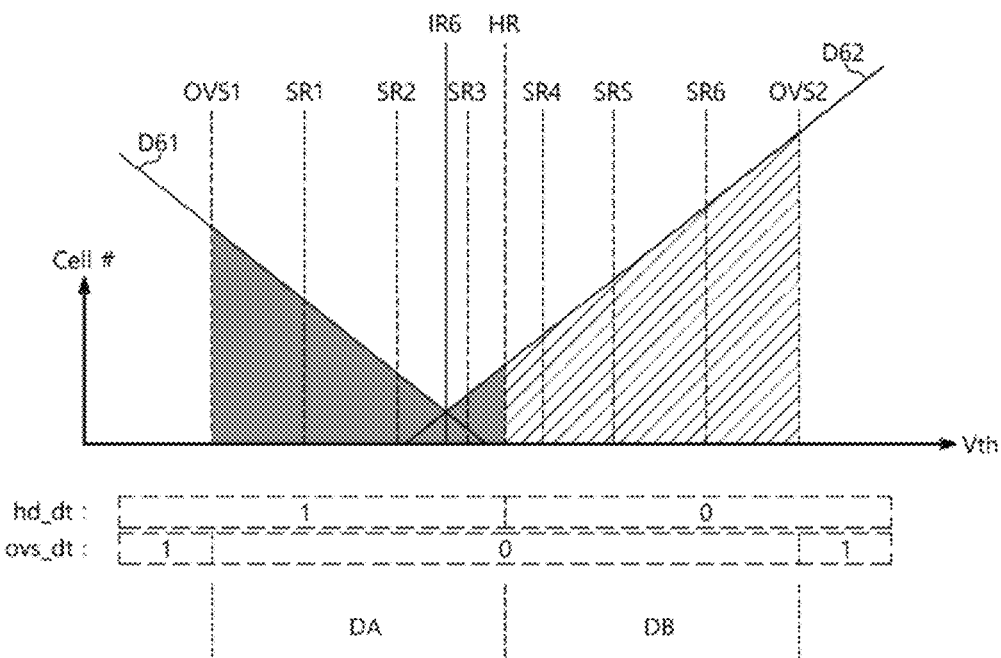
FIG. 6 is a representation of a diagram to assist in the explanation of an example of a method for the estimation unit of FIG. 1 to estimate the deviation direction and the deviation degree of a hard read voltage in accordance with the embodiment.

FIG. 6 is a representation of a diagram to assist in the explanation of an example of a method for the estimation unit 113 of FIG. 1 to estimate the deviation direction and the deviation degree of a hard read voltage HR with respect to a reference based on the threshold voltage distributions of the memory cells in accordance with the embodiment. FIG. 6 exemplarily shows parts of threshold voltage distributions D61 and D62, the valley voltage IR6 (labeled as an ideal read voltage) between the threshold voltage distributions D61 and D62, the hard read voltage HR and soft read voltages SR1 to SR6.

Referring to FIG. 6, in order to estimate the deviation direction and the deviation degree of the hard read voltage HR with respect to the valley voltage IR6, the estimation unit 113 may refer to hard data hd_dt and oversampling data ovs_dt.

The hard data hd_dt may be the data read from the memory cells MC as the hard read voltage HR is applied to the memory cells MC. The hard data hd_dt may be read as a first value, for example, "0," from a memory cell having a threshold voltage larger than the hard read voltage HR, and may be read as a second value, for example, "1," from a memory cell having a threshold voltage smaller than the hard read voltage HR.

The estimation unit 113 may obtain the oversampling data ovs_dt by performing an oversampling read operation for the memory cells MC based first and second oversampling read voltages OVS1 and OVS2. The first oversampling read voltage OVS1 may be smaller than the hard read voltage HR by a predetermined offset value, and the second oversampling read voltage OVS2 may be larger than the hard read voltage HR by the predetermined offset value. While, as shown, the first and second oversampling read voltages OVS1 and OVS2 may be positioned outside the voltage range of the soft read voltages SR1 and SR6 which are positioned outermost among the soft read voltages SR1 to SR6, it is to be noted that an implementation of the present embodiment is not limited thereto.

As described above, the oversampling data ovs_dt may be obtained as a first value, for example, "0," from a memory cell which has a threshold voltage larger than the first oversampling read voltage OVS1 and smaller than the second oversampling read voltage OVS2. The oversampling data ovs_dt may be obtained as a second value, for example, "1," from a memory cell which has a threshold voltage smaller than the first oversampling read voltage OVS1 or larger than the second oversampling read voltage OVS2.

The estimation unit 113 may count the numbers of memory cells which are positioned in counting threshold voltage intervals DA and DB, respectively, by referring to the hard data hd_dt and the oversampling data ovs_dt.

As a specific example, the counting threshold voltage interval DA may be the range of threshold voltages which are larger than the first oversampling read voltage OVS1 and smaller than the hard read voltage HR. The memory cells (indicated by shading) positioned in the counting threshold voltage interval DA may have threshold voltages which are larger than the first oversampling read voltage OVS1 and smaller than the hard read voltage HR. That is to say, memory cells each of which hard data hd_dt is read as "1" and each of which oversampling data ovs_dt is read as "0" may be positioned in the counting threshold voltage interval DA.

Furthermore, the counting threshold voltage interval DB may be the range of threshold voltages which are larger than the hard read voltage HR and smaller than the second oversampling read voltage OVS2. The memory cells (indicated by hatching) positioned in the counting threshold voltage interval DB may have threshold voltages which are larger than the hard read voltage HR and smaller than the second oversampling read voltage OVS2. Accordingly, memory cells each of which hard data hd_dt is read as "0" and each of which oversampling data ovs_dt is read as "0" may be positioned in the counting threshold voltage interval DB.

As shown in FIG. 6, when the deviation direction of the hard read voltage HR with respect to the valley voltage IR6 between the threshold voltage distributions D61 and D62 is positive, the number of memory cells positioned in the counting threshold voltage interval DA, that is, a first estimation value NUM_DA, may be less than the number of memory cells positioned in the counting threshold voltage interval DB, that is, a second estimation value NUM_DB.

Based on the above, the estimation unit 113 may estimate the deviation direction of the hard read voltage HR based on the first estimation value NUM_DA and the second estimation value NUM_DB as in the following [Table 1].

TABLE 1

| | Deviation direction |
|---|---|
| NUM_DA < NUM_DB | Positive |
| NUM_DA > NUM_DB | Negative |

In addition, as the deviation degree of the hard read voltage HR with respect to the valley voltage IR6 between the threshold voltage distributions D61 and D62 is large, the absolute value of the difference between the first estimation value NUM_DA and the second estimation value NUM_DB may be large.

Hence, the estimation unit 113 may estimate the deviation degree of the hard read voltage HR based on the first estimation value NUM_DA and the second estimation value NUM_DB as in the following [Table 2]. According to the [Table 2], the estimation unit 113 may estimate whether the deviation degree is large or small, by comparing the absolute difference of the first estimation value NUM_DA and the second estimation value NUM_DB with a reference value RNUM.

TABLE 2

| | Deviation degree |
|---|---|
| |NUM_DA − NUM_DB| < RNUM | Small |
| |NUM_DA − NUM_DB| > RNUM | Large |

According to an embodiment, the estimation unit 113 may determine the deviation degree of the hard read voltage HR not by dividing it into two states as being large or small through using only one reference value RNUM but by subdividing it through using a plurality of reference values.

Figure 7:
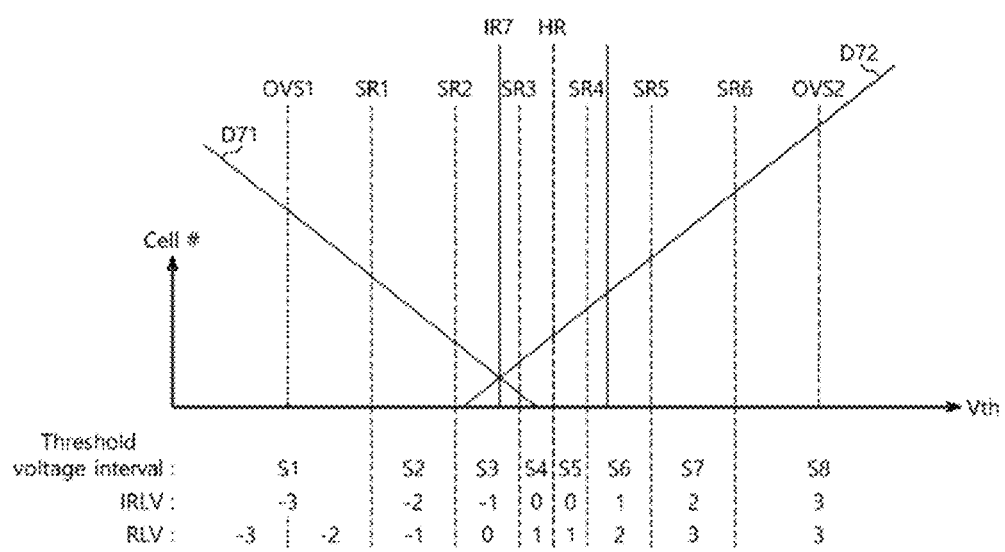
FIGS. 7 and 8 are representations of diagrams to assist in the explanation of an example of a method for the reliability value allocation unit of FIG. 1 to allocate reliability values to threshold voltage intervals in accordance with the embodiment.
Figure 8:
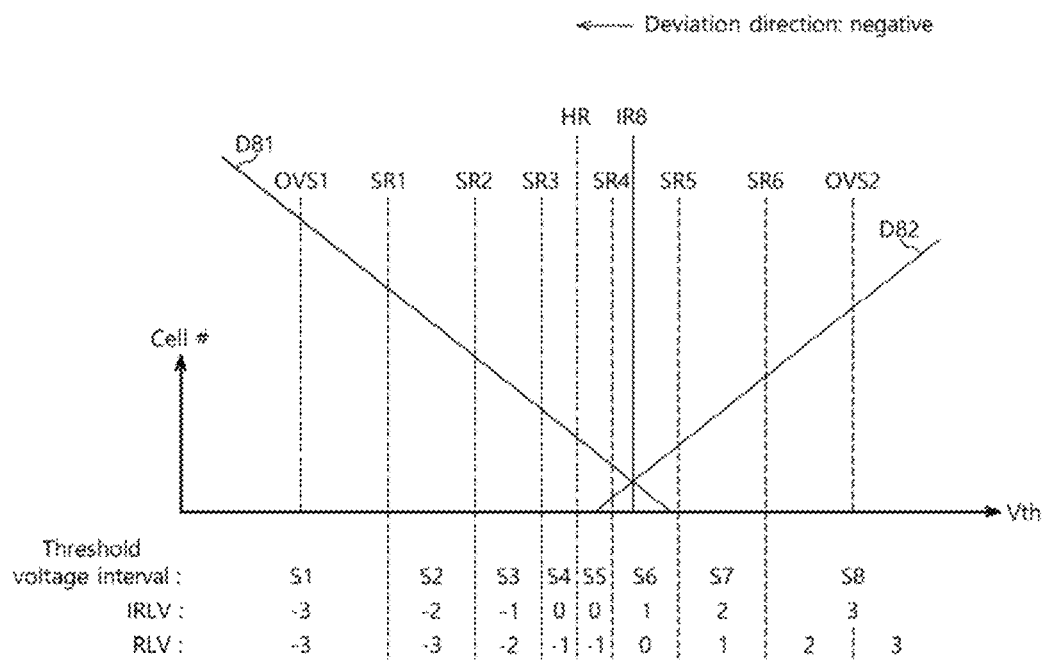

FIGS. 7 and 8 are representations of diagrams to assist in the explanation of an example of a method for the reliability value allocation unit 114 of FIG. 1 to allocate reliability values RLV to threshold voltage intervals S1 to S8 in accordance with the embodiment. In FIGS. 7 and 8, the reliability value allocation unit 114 may first allocate the reliability values RLV based on the deviation direction of a hard read voltage HR. In FIG. 7, the deviation direction of the hard read voltage HR with respect to the valley voltage IR7 (labeled as an ideal read voltage) between the threshold voltage distributions D71 and D72 may be used in allocating the reliability values RLV, and in FIG. 8, the deviation direction of the hard read voltage HR with respect to the valley voltage IR8 between threshold voltage distributions D81 and D82 may be used in allocating the reliability values RLV.

Referring to FIG. 7, the deviation direction of the hard read voltage HR with respect to the valley voltage IR7 may be positive. The reliability value allocation unit 114 may allocate the reliability values RLV to the threshold voltage intervals S1 to S8 by adjusting initial reliability values IRLV by a positive adjustment value, for example, "1."

While the magnitude of the reliability values RLV may be increased to "3," it is to be noted that the present embodiment is not limited thereto.

In a situation where first and second oversampling read voltages OVS1 and OVS2 are positioned outside outermost soft read voltages SR1 and SR6 as shown, the respective outermost threshold voltage intervals S1 and S8 may be divided by the first and second oversampling read voltages OVS1 and OVS2, respectively. Therefore, according to an embodiment, the reliability value allocation unit 114 may allocate reliability values RLV to divided intervals by subdividing them within a maximum magnitude, for example, "3." As a more specific example, when the threshold voltage interval S1 is divided into two intervals by the first oversampling read voltage OVS1, the reliability value allocation unit 114 may allocate a reliability value "−2" adjusted from an initial reliability value "−3" to an inner interval close to the hard read voltage HR, and may allocate a reliability value "−3" of a larger magnitude to an outer interval.

Referring to FIG. 8, the deviation direction of the hard read voltage HR with respect to the valley voltage IR8 between threshold voltage distributions D81 and D82 may be negative. The reliability value allocation unit 114 may allocate the reliability values RLV to the threshold voltage intervals S1 to S8 by adjusting initial reliability values IRLV by a negative adjustment value, for example, "−1."

When the threshold voltage interval S8 is divided into two intervals by the second oversampling read voltage OVS2, the reliability value allocation unit 114 may allocate a reliability value "2" adjusted from an initial reliability value "3" to an inner interval close to the hard read voltage HR, and may allocate a reliability value "3" of a larger magnitude to an outer interval.

In the example shown in FIGS. 7 and 8, the reliability value allocation unit 114 operates based only on the deviation direction of the hard read voltage HR without using the deviation degree of the hard read voltage HR. When only the deviation direction of the hard read voltage HR is used, the adjustment value of the initial reliability values IRLV may be uniform. As will be described below, when a deviation degree is additionally used by the reliability value allocation unit 114 and is large, the reliability value allocation unit 114 may adjust initial reliability values IRLV by using nonuniform adjustment values. When the deviation degree is small, the reliability value allocation unit 114 may adjust initial reliability values IRLV by using a uniform adjustment value, and a method thereof may be substantially the same as described above with reference to FIGS. 7 and 8.

Figure 9:
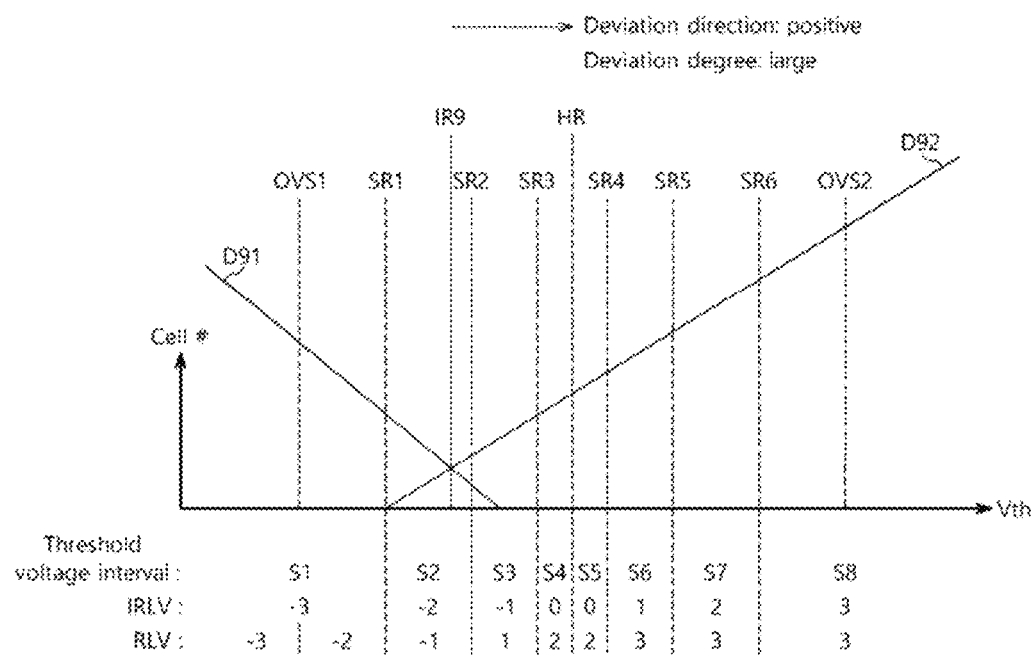
FIGS. 9 and 10 are representations of diagrams to assist in the explanation of an example of a method for the reliability value allocation unit of FIG. 1 to allocate reliability values to threshold voltage intervals in accordance with the embodiment.
Figure 10:
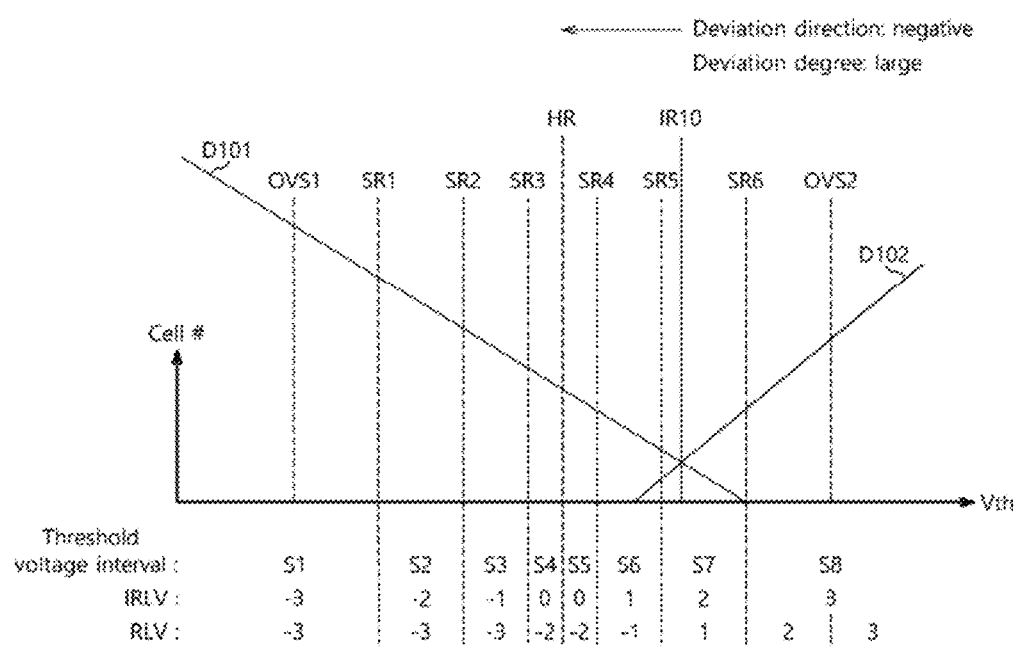

FIGS. 9 and 10 are representations of examples of diagrams to assist in the explanation of an example of a method for the reliability value allocation unit 114 of FIG. 1 to allocate reliability values RLV to threshold voltage intervals S1 to S8 in accordance with the embodiment. In FIGS. 9 and 10, the reliability value allocation unit 114 may allocate the reliability values RLV based on the deviation direction and the deviation degree of a hard read voltage HR. In FIG. 9, the deviation direction of the hard read voltage HR with respect to a voltage IR9 of a valley between threshold voltage distributions D91 and D92 may be used in allocating the reliability values RLV, and in FIG. 10, the deviation direction of the hard read voltage HR with respect a voltage IR10 of a valley between threshold voltage distributions D101 and D102 may be used in allocating the reliability values RLV.

Referring to FIG. 9, the deviation direction of the hard read voltage HR with respect to the voltage IR9 may be positive. A method for the reliability value allocation unit 114 based on the deviation direction of the hard read voltage HR may be the same as described above with reference to FIG. 7. In other words, when the deviation direction of the hard read voltage HR is positive, the reliability value allocation unit 114 may allocate the reliability values RLV by adjusting initial reliability values IRLV by a positive adjustment value for the threshold voltage intervals S1 to S8.

In this regard, when the deviation degree of the hard read voltage HR is large, the reliability value allocation unit 114 may adjust the initial reliability values IRLV by nonuniform positive adjustment values.

In detail, the reliability value allocation unit 114 may adjust the initial reliability values IRLV of some threshold voltage intervals in the deviation direction, for example, the threshold voltage intervals S3 to S8, among the threshold voltage intervals S1 to S8, by a first adjustment value, for example, "2," and may adjust the initial reliability values IRLV of the remaining threshold voltage intervals S1 and S2 by a second adjustment value, for example, "1." Namely, the magnitude of the first adjustment value may be greater than the magnitude of the second adjustment value.

The boundary between some threshold voltage intervals S3 to S8 to which the first adjustment value is applied and the remaining threshold voltage intervals S1 and S2 to which the second adjustment value is applied may be positioned in a direction opposite to the deviation direction of the hard read voltage HR based on the hard read voltage HR.

Referring to FIG. 10, the deviation direction of the hard read voltage HR with respect to the voltage IR10 for the valley between threshold voltage distributions D101 and D102 may be negative. A method for the reliability value allocation unit 114 based on the deviation direction of the hard read voltage HR may be the same as described above with reference to FIG. 8. In other words, when the deviation direction of the hard read voltage HR is negative, the reliability value allocation unit 114 may allocate the reliability values RLV by adjusting initial reliability values IRLV by a negative adjustment value for the threshold voltage intervals S1 to S8.

In this regard, when the deviation degree of the hard read voltage HR is large, the reliability value allocation unit 114 may adjust the initial reliability values IRLV by nonuniform negative adjustment values.

In detail, the reliability value allocation unit 114 may adjust the initial reliability values IRLV of some threshold voltage intervals in the deviation direction, for example, the threshold voltage intervals S1 to S6, among the threshold voltage intervals S1 to S8, by a first adjustment value, for example, "−2," and may adjust the initial reliability values IRLV of the remaining threshold voltage intervals S7 and S8 by a second adjustment value, for example, "−1." Namely, the magnitude of the first adjustment value may be greater than the magnitude of the second adjustment value.

The boundary between some threshold voltage intervals S1 to S6 to which the first adjustment value is applied and the remaining threshold voltage intervals S7 and S8 to which the second adjustment value is applied may be positioned in a direction opposite to the deviation direction of the hard read voltage HR based on the hard read voltage HR.

Figure 11:
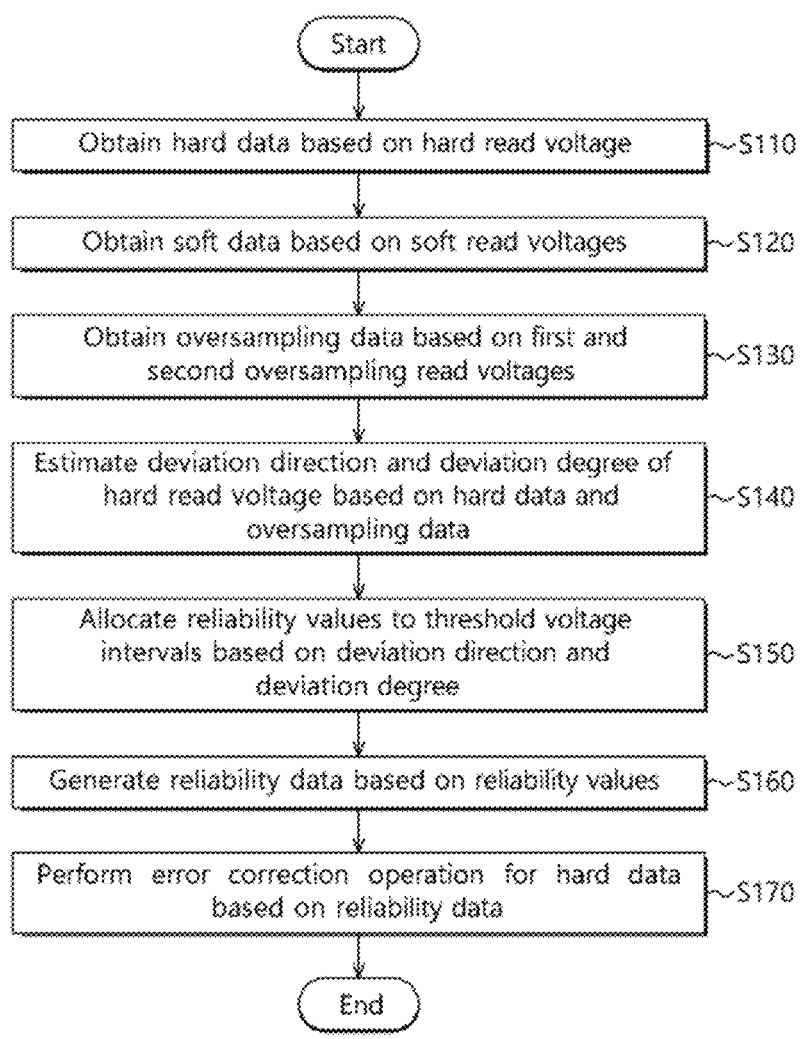
FIG. 11 is a representation of a flow chart to assist in the explanation of an example of a method for operating the memory system of FIG. 1, in accordance with an embodiment.

FIG. 11 is a representation of an example of a flow chart to assist in the explanation of an example of a method for operating the memory system 100 of FIG. 1, in accordance with an embodiment.

At step S110, the controller 110 may obtain hard data hd_dt by performing a hard read operation for the memory cells MC based on a hard read voltage.

At step S120, the controller 110 may obtain soft data sf_dt by performing a soft read operation for the memory cells MC based on soft read voltages.

At step S130, the controller 110 may obtain oversampling data ovs_dt by performing an oversampling read operation for the memory cells MC based first and second oversampling read voltages.

At step S140, the estimation unit 113 may estimate the deviation direction and the deviation degree of the hard read voltage based on the hard data hd_dt and the oversampling data ovs_dt.

At step S150, the reliability value allocation unit 114 may allocate reliability values RLV to threshold voltage intervals based on the deviation direction and the deviation degree of the hard read voltage. The threshold voltage intervals may be divided by the hard read voltage and the soft read voltages.

At step S160, the reliability value allocation unit 114 may generate reliability data RLV_dt based on the reliability values RLV. The reliability value allocation unit 114 may determine a threshold voltage interval where each of the memory cells MC is positioned, based on the hard data hd_dt and the soft data sf_dt, and may allocate a reliability value allocated to the threshold voltage interval, to the corresponding memory cell. The reliability value allocated to the memory cell may be reliability data RLV_dt corresponding to the hard data read from the corresponding memory cell.

At step S170, the error correction circuit 112 may perform an error correction operation for the hard data hd_dt, based on the reliability data RLV_dt.

Figure 12:
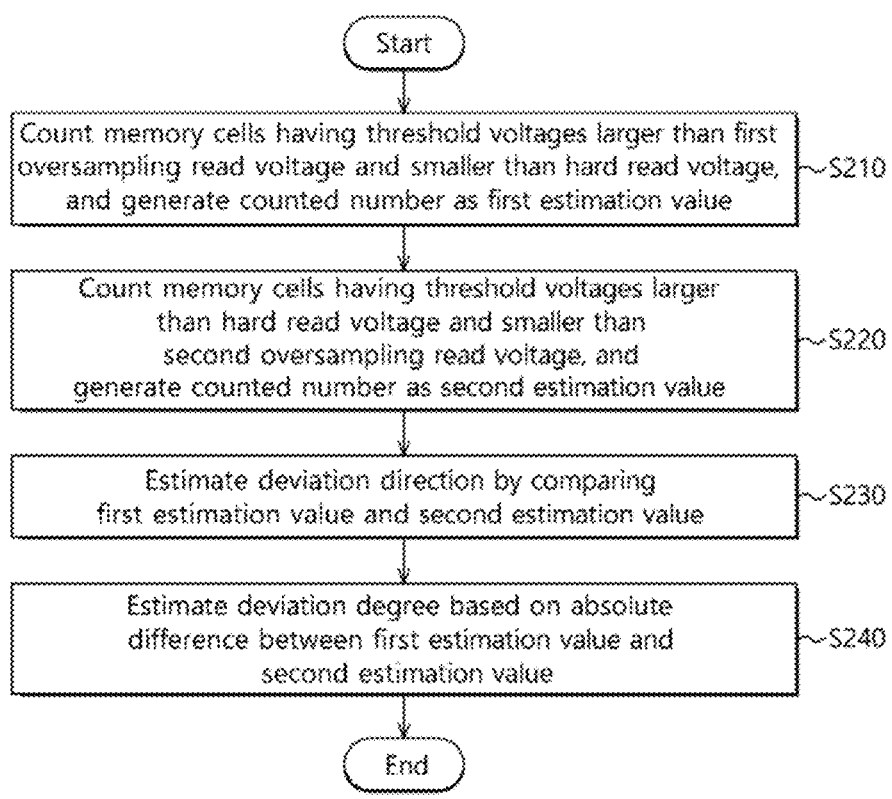
FIG. 12 is a representation of a flow chart to assist in the explanation of an example of a method for operating the estimation unit of FIG. 1, in accordance with an embodiment.

FIG. 12 is a representation of an example of a flow chart to assist in the explanation of an example of a method for operating the estimation unit 113 of FIG. 1, in accordance with an embodiment. The process shown in FIG. 12 may be an example of the step S140 of FIG. 11.

At step S210, the estimation unit 113 may count memory cells which have threshold voltages larger than the first oversampling read voltage and smaller than the hard read voltage, and may generate a counted result as a first estimation value.

At step S220, the estimation unit 113 may count memory cells which have threshold voltages larger than the hard read voltage and smaller than the second oversampling read voltage, and may generate a counted result as a second estimation value.

At step S230, the estimation unit 113 may estimate the deviation direction and the deviation degree of the hard read voltage by comparing the first estimation value and the second estimation value. For example, the estimation unit 113 may estimate that the deviation direction of the hard read voltage is positive, when the first estimation value is smaller than the second estimation value. The estimation unit 113 may estimate that the deviation direction of the hard read voltage is negative, when the first estimation value is larger than the second estimation value.

At step S240, the estimation unit 113 may estimate that the deviation degree of the hard read voltage is large, as the absolute difference of the first and second estimation values is large. For example, when the absolute difference of the first and second estimation values is larger than a reference value, the estimation unit 113 may estimate that the deviation degree of the hard read voltage is large. When the absolute difference of the first and second estimation values is smaller than the reference value, the estimation unit 113 may estimate that the deviation degree of the hard read voltage is small.

Figure 13:
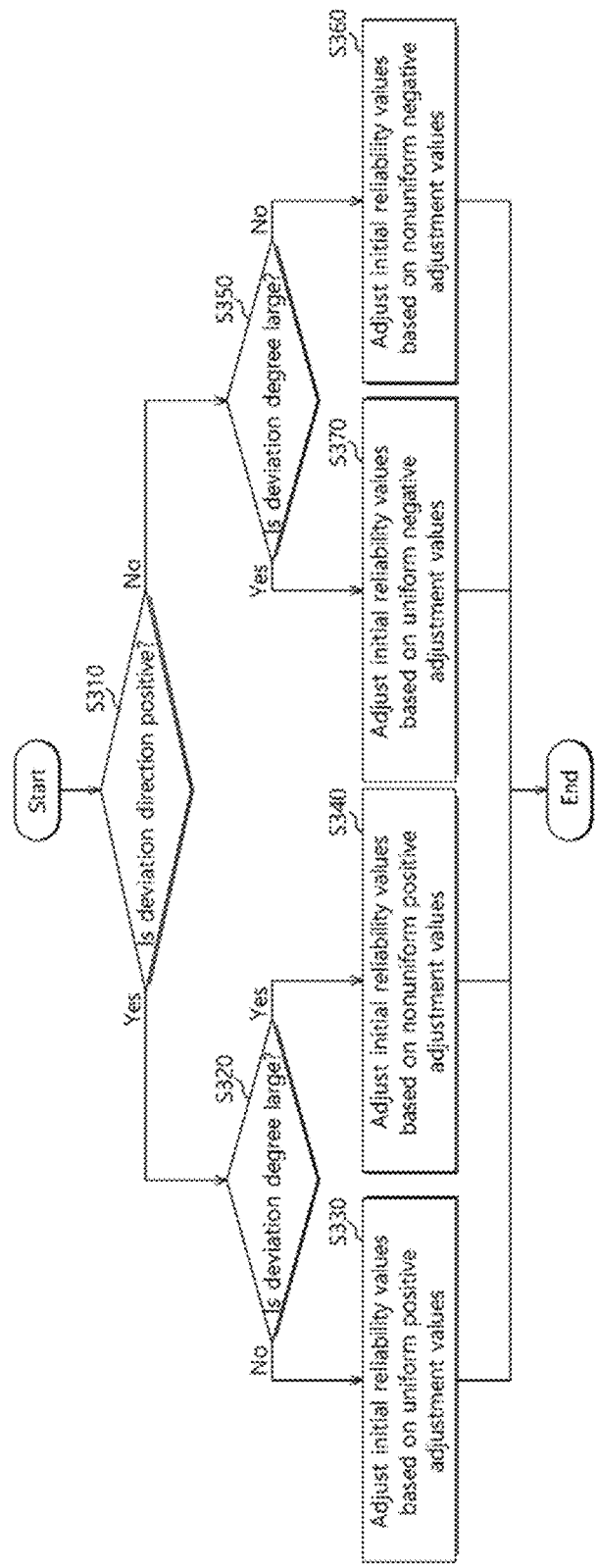
FIG. 13 is a representation of a flow chart to assist in the explanation of an example of a method for operating the reliability value allocation unit of FIG. 1, in accordance with an embodiment.

FIG. 13 is a representation of an example of a flow chart to assist in the explanation of a method for operating the reliability value allocation unit 114 of FIG. 1, in accordance with an embodiment. The process shown in FIG. 13 may be an example for implementing the step S150 of FIG. 11.

At step S310, the reliability value allocation unit 114 may determine whether the deviation direction of the hard read voltage is positive. When the deviation direction is positive, the process may proceed to step S320. When the deviation direction is negative, the process may proceed to step S350.

At the step S320, the reliability value allocation unit 114 may determine whether the deviation degree of the hard read voltage is large. When the deviation degree is small, the process may proceed to step S330. When the deviation degree is large, the process may proceed to step S340.

At the step S330, the reliability value allocation unit 114 may allocate reliability values to the threshold voltage intervals by adjusting initial reliability values corresponding to the threshold voltage intervals based on a uniform positive adjustment value.

At the step S340, the reliability value allocation unit 114 may allocate reliability values to the threshold voltage intervals by adjusting initial reliability values corresponding to the threshold voltage intervals based on nonuniform positive adjustment values.

At the step S350, the reliability value allocation unit 114 may determine whether the deviation degree of the hard read voltage is large. When the deviation degree is small, the process may proceed to step S360. When the deviation degree is large, the process may proceed to step S370.

At the step S360, the reliability value allocation unit 114 may allocate reliability values to the threshold voltage intervals by adjusting initial reliability values corresponding to the threshold voltage intervals based on a uniform negative adjustment value.

At the step S370, the reliability value allocation unit 114 may allocate reliability values to the threshold voltage intervals by adjusting initial reliability values corresponding to the threshold voltage intervals based on nonuniform negative adjustment values.

Based on the above disclosure, a memory system can be constructed to perform error correction on the hard data based on the reliability values obtained from hard data and oversampling data. Such a system can include one or more memory devices including a plurality of memory cells, and operable to apply a hard read voltage to the memory cells to read data based on comparison with threshold voltage distributions of the memory cells; a controller in communication with the one or more memory devices to control operations performed on the memory cells; and memory for storing one or more instructions configured to be executed by the controller. The instruction stored on the memory include instructions for performing a soft read operation on the memory cells based on a plurality of soft read voltages that subdivides the threshold voltage distributions into a plurality of threshold voltage intervals; instructions for allocating an initial reliability value to each threshold voltage interval based on data read out in the soft read operation; instructions for performing an oversampling read operation on the memory cells based on oversampling read voltages; instructions for counting a number of memory cells of which the threshold voltages exist between the hard read voltage and oversampling read voltages and comparing each counting result; instructions for adjusting the initial reliability value by estimating a current threshold voltage distribution based on the comparing result; and instructions for performing a soft decision decoding operation based on the adjusted reliability value.

In implementing the above memory system, the oversampling read voltages can include a first oversampling read voltage lower than the hard read voltage and a second oversampling read voltage higher than the hard read voltage. The instructions for counting are performed by counting a number of first memory cells of which the threshold voltages exist between the first oversampling read voltage and the hard read voltage and a number of second memory cells of which the threshold voltages exist between the hard read voltage and the second oversampling read voltage. Here, estimating the current threshold voltage distribution is performed by comparing the numbers of the first memory cells and the second memory cells. In an implementation, estimating the current threshold voltage distribution based on the comparing result may be performed based on information obtained by comparing a currently counted numbers of the first memory cells and the second memory cells with a previously counted numbers of the first memory cells and the second memory cells.

The above techniques of performing error correction on the hard data based on the reliability values obtained from hard data and oversampling data can be applied in various memory systems. FIGS. 14-18 provide some examples of such memory systems.

Figure 14:
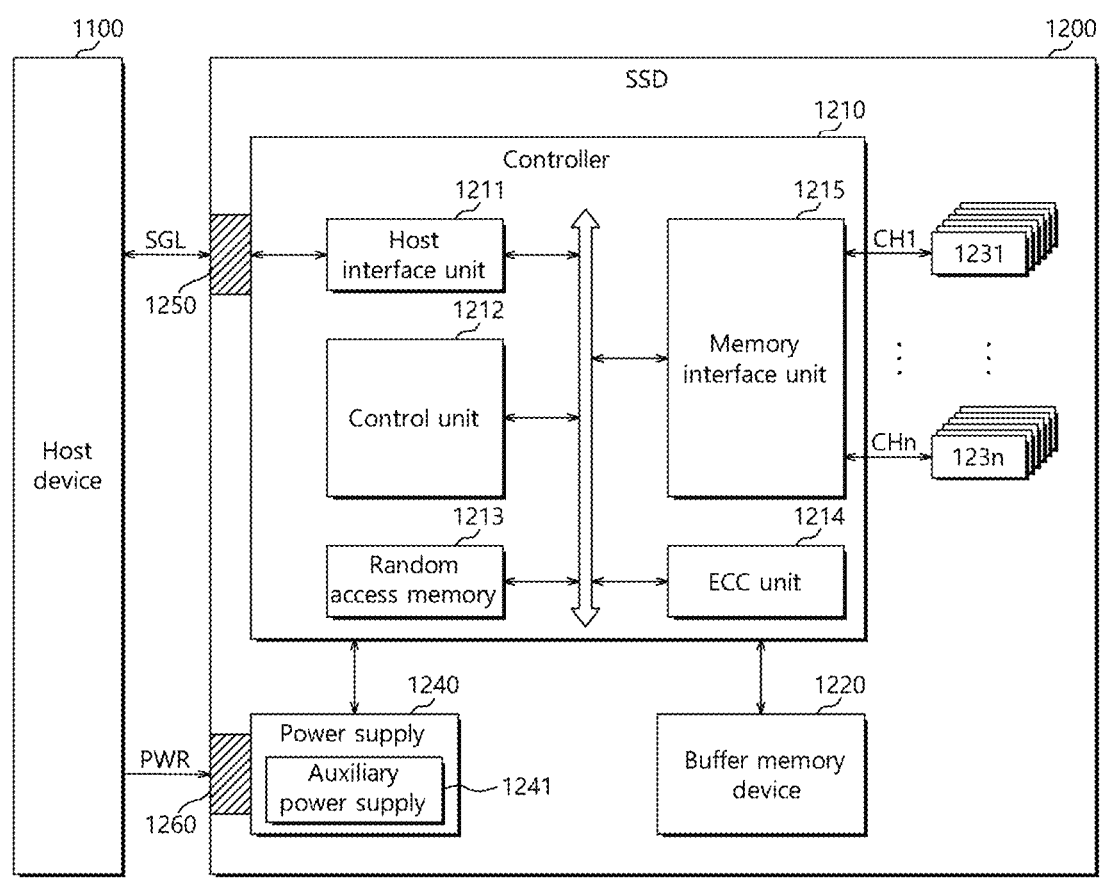
FIG. 14 is a diagram illustrating a data processing system including a solid state drive (SSD) in accordance with an embodiment.

FIG. 14 is a diagram illustrating a data processing system 1000 including a solid state drive (SSD) 1200 in accordance with an embodiment. Referring to FIG. 14, the data processing system 1000 may include a host device 1100 and the SSD 1200.

The SSD 1200 may include a controller 1210, a buffer memory device 1220, a plurality of nonvolatile memory devices 1231 to 123n, a power supply 1240, a signal connector 1250, and a power connector 1260.

The controller 1210 may control general operations of the SSD 1200. The controller 1210 may include a host interface unit 1211, a control unit 1212, a random access memory 1213, an error correction code (ECC) unit 1214, and a memory interface unit 1215.

The host interface unit 1211 may exchange a signal SGL with the host device 1100 through the signal connector 1250. The signal SGL may include a command, an address, data, and so forth. The host interface unit 1211 may interface the host device 1100 and the SSD 1200 according to the protocol of the host device 1100. For example, the host interface unit 1211 may communicate with the host device 1100 through a suitable interface protocol, including, e.g., standard interface protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-E) or universal flash storage (UFS).

The control unit 1212 may analyze and process the signal SGL received from the host device 1100. The control unit 1212 may control operations of internal function blocks according to a firmware or a software for driving the SSD 1200. The random access memory 1213 may be used as a working memory for driving such a firmware or software.

The ECC unit 1214 may generate the parity data of data to be transmitted to at least one of the nonvolatile memory devices 1231 to 123n. The generated parity data may be stored together with the data in the nonvolatile memory devices 1231 to 123n. The ECC unit 1214 may detect an error of the data read from at least one of the nonvolatile memory devices 1231 to 123n, based on the parity data. If a detected error is within a correctable range, the ECC unit 1214 may correct the detected error.

The memory interface unit 1215 may provide control signals such as commands and addresses to at least one of the nonvolatile memory devices 1231 to 123n, according to control of the control unit 1212. Moreover, the memory interface unit 1215 may exchange data with at least one of the nonvolatile memory devices 1231 to 123n, according to control of the control unit 1212. For example, the memory interface unit 1215 may provide the data stored in the buffer memory device 1220, to at least one of the nonvolatile memory devices 1231 to 123n, or provide the data read from at least one of the nonvolatile memory devices 1231 to 123n, to the buffer memory device 1220.

The buffer memory device 1220 may temporarily store data to be stored in at least one of the nonvolatile memory devices 1231 to 123n. Further, the buffer memory device 1220 may temporarily store the data read from at least one of the nonvolatile memory devices 1231 to 123n. The data temporarily stored in the buffer memory device 1220 may be transmitted to the host device 1100 or at least one of the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 15:
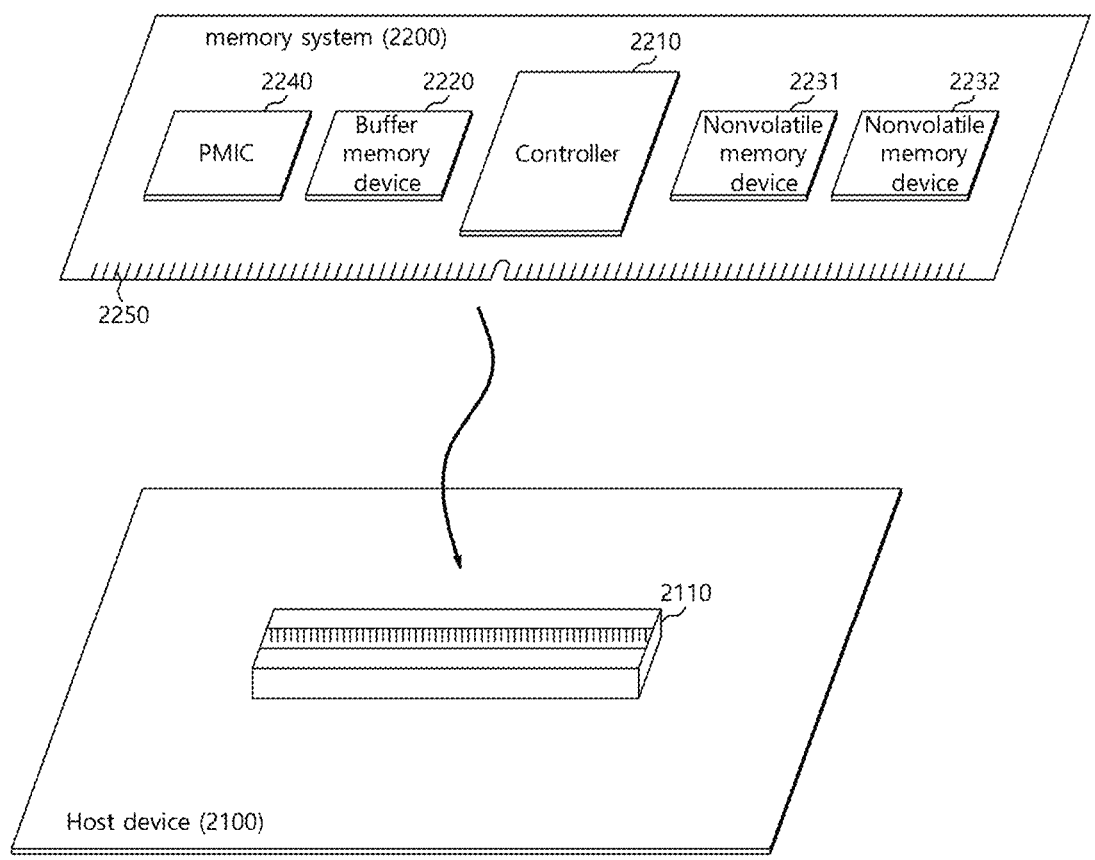
FIG. 15 is a diagram illustrating a data processing system including a memory system in accordance with an embodiment.

FIG. 15 is a diagram illustrating a data processing system 2000 including a memory system 2200 in accordance with an embodiment. Referring to FIG. 15, the data processing system 2000 may include a host device 2100 and the memory system 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control general operations of the memory system 2200. The controller 2210 may be configured in the same manner as the controller 1210 shown in FIG. 14.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the memory system 2200.

The PMIC 2240 may provide the power inputted through the connection terminal 2250, to the inside of the memory system 2200. The PMIC 2240 may manage the power of the memory system 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the memory system 2200. The connection terminal 2250 may be configured into various types depending on an interface scheme between the host device 2100 and the memory system 2200. The connection terminal 2250 may be disposed on any one side of the memory system 2200.

Figure 16:
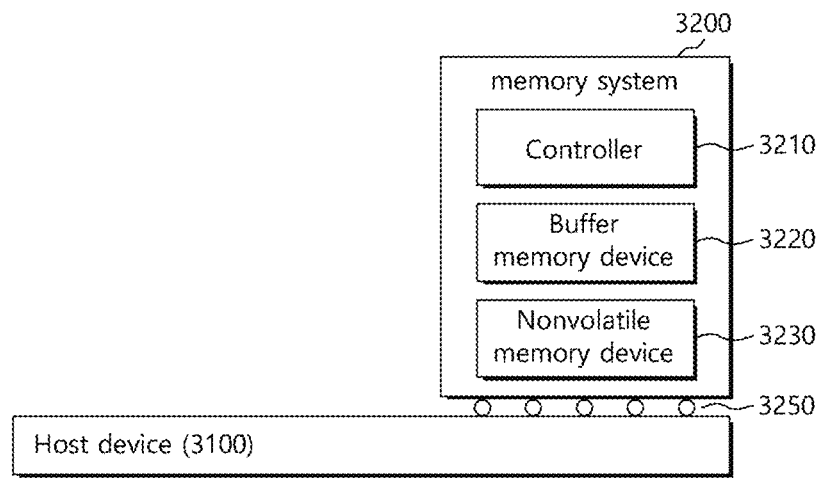
FIG. 16 is a diagram illustrating a data processing system including a memory system in accordance with an embodiment.

FIG. 16 is a diagram illustrating a data processing system 3000 including a memory system 3200 in accordance with an embodiment. Referring to FIG. 16, the data processing system 3000 may include a host device 3100 and the memory system 3200.

The host device 3100 may be configured in the form of a board such as a printed circuit board. Although not shown, the host device 3100 may include internal function blocks for performing the function of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a nonvolatile memory device 3230.

The controller 3210 may control general operations of the memory system 3200. The controller 3210 may be configured in the same manner as the controller 1210 shown in FIG. 14.

The buffer memory device 3220 may temporarily store data to be stored in the nonvolatile memory device 3230. Further, the buffer memory device 3220 may temporarily store the data read from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the memory system 3200.

Figure 17:
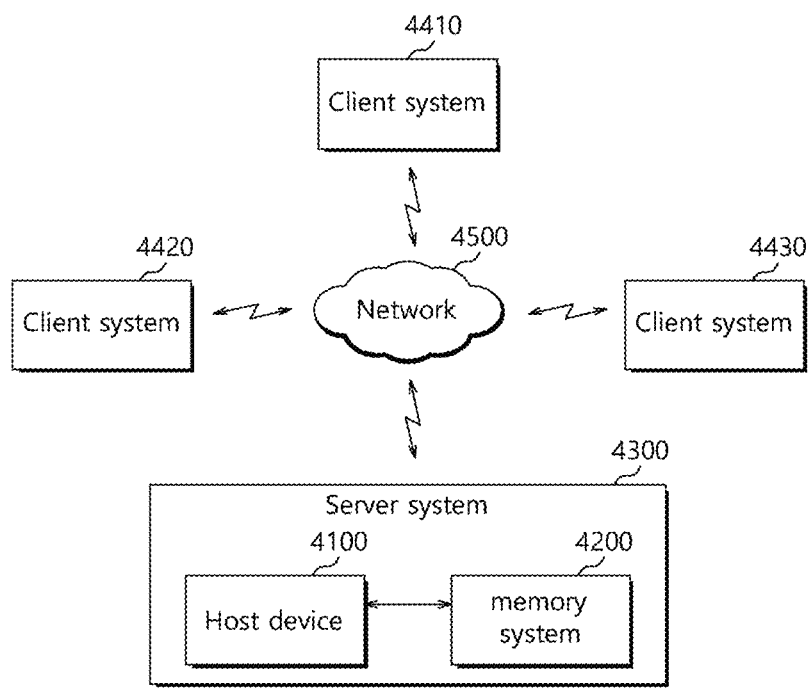
FIG. 17 is a diagram illustrating a network system including a memory system in accordance with an embodiment.

FIG. 17 is a diagram illustrating a network system 4000 including a memory system 4200 in accordance with an embodiment. Referring to FIG. 17, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured by the memory system 100 shown in FIG. 1, the memory system 1200 shown in FIG. 14, the memory system 2200 shown in FIG. 15 or the memory system 3200 shown in FIG. 16.

Figure 18:
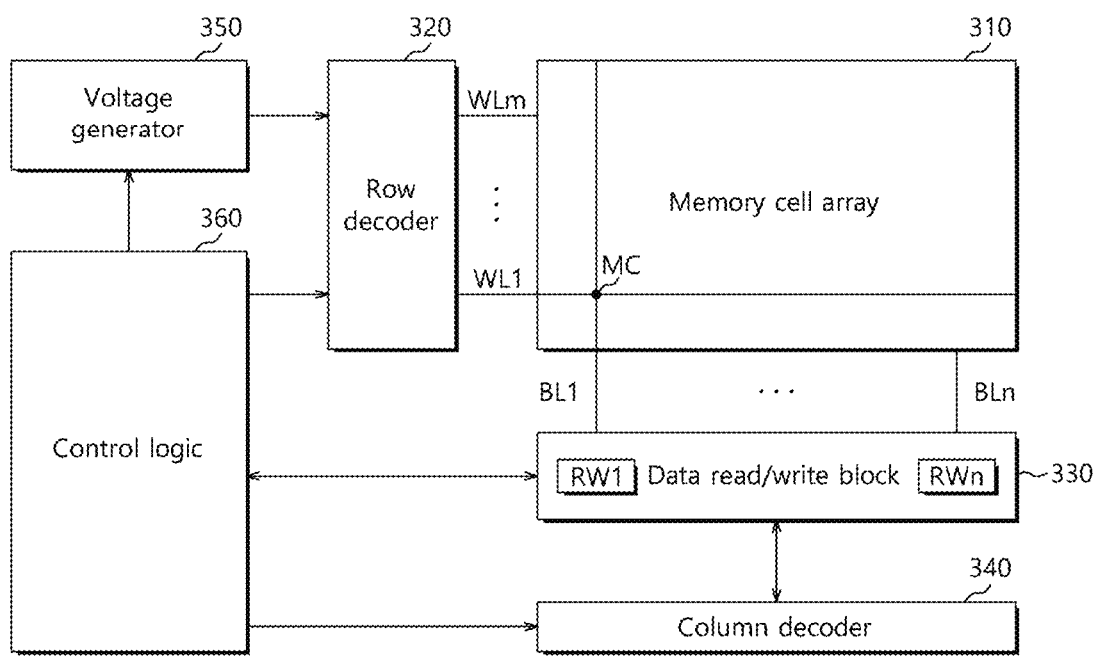
FIG. 18 is a block diagram illustrating a nonvolatile memory device included in a memory system in accordance with an embodiment.

FIG. 18 is a block diagram illustrating a nonvolatile memory device 300 included in a memory system in accordance with an embodiment. Referring to FIG. 18, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Only a few implementations and examples are described and other implementations, enhancements and variations can be made based on what is described and illustrated in this patent document.

What is claimed is:

1. A memory system comprising:
   a nonvolatile memory device including a plurality of memory cells, and operable to apply a read voltage to the memory cells to read data in a read operation; and
   a controller in communication with the nonvolatile memory device to control operations of the memory cells, the controller configured to:
   obtain hard data by performing a hard read operation based on a hard read voltage applied to the memory cells;
   obtain oversampling data from the memory cells by performing an oversampling read operation based on first and second oversampling read voltages applied to the memory cells;
   estimate a deviation direction indicating whether the hard read voltage is larger or smaller than a reference voltage based on threshold voltage distributions of the memory cells by processing the hard data and the oversampling data;
   adjust initial reliability values corresponding to a plurality of threshold voltage intervals based on the deviation direction; and
   perform an error correction operation for the hard data based on the adjusted reliability values.

2. The memory system according to claim 1, wherein the oversampling data is obtained as a first value from a memory cell which has a threshold voltage larger than the first oversampling read voltage and smaller than the second oversampling read voltage, and is obtained as a second value from a memory cell which has a threshold voltage smaller than the first oversampling read voltage or larger than the second oversampling read voltage.

3. The memory system according to claim 1, wherein the first oversampling read voltage is smaller than the hard read voltage by an offset value, and the second oversampling read voltage is larger than the hard read voltage by the offset value.

4. The memory system according to claim 1, wherein the controller is further configured to:
   count memory cells that have threshold voltages larger than the first oversampling read voltage and smaller than the hard read voltage and generate a counted number as a first estimation value;
   count memory cells that have threshold voltages larger than the hard read voltage and smaller than the second oversampling read voltage and generate a counted number as a second estimation value; and
   estimate the deviation direction by comparing the first estimation value and the second estimation value.

5. The memory system according to claim 4, wherein the controller is further configured to:
   estimate the deviation direction as a positive value when the first estimation value is smaller than the second estimation value; and
   estimate the deviation direction as a negative value when the first estimation value is larger than the second estimation value.

6. The memory system according to claim 4, wherein the controller is further configured to:
   adjust the initial reliability values corresponding to the threshold voltage intervals by a positive adjustment value when the deviation direction is positive; and
   adjust the initial reliability values by a negative adjustment value when the deviation direction is negative.

7. The memory system according to claim 6, wherein the controller is further configured to:
   additionally estimate a deviation degree of the hard read voltage based on an absolute difference of the first estimation value and the second estimation value; and
   nonuniformiy adjust the initial reliability values corresponding to the threshold voltage intervals based on the deviation degree.

8. The memory system according to claim 7, wherein the controller is further configured to:
   adjust one or more of the initial reliability values corresponding to one or more threshold voltage intervals among the threshold voltage intervals by a first adjustment value; and
   adjust one or more remaining initial reliability values corresponding to one or more remaining threshold voltage intervals by a second adjustment value,
   wherein a boundary between the one or more threshold voltage intervals and the one or more remaining threshold voltage intervals is positioned in a direction opposite to the deviation direction based on the hard read voltage, and
   wherein a magnitude of the first adjustment value is greater than a magnitude of the second adjustment value.

9. The memory system according to claim 1, wherein the controller is further configured to:
   obtain soft data associated with the hard data of the memory cells by performing a soft read operation based on a plurality of soft read voltages applied to the memory cells;
   determine a threshold voltage interval where each of the memory cells is positioned, based on the hard data and the soft data; and
   generate reliability data for the error correction operation by allocating at least one of the adjusted reliability value allocated to the threshold voltage interval, to a corresponding memory cell.

10. The memory system according to claim 9, wherein the threshold voltage intervals are divided by the hard read voltage and the soft read voltages.

11. The memory system according t the controller includes:
    an estimation unit operable to perform the oversampling, read operation based on the first and second oversampling read voltages applied to the memory cells to obtain the oversampling data from the memory cells and to estimate the deviation direction of the hard read voltage based on the hard data and the oversampling data; and
    a reliability value allocation unit in communication with the estimation unit and operable to allocate the adjusted reliability values to a plurality of threshold voltage intervals based on the deviation direction.

12. A method for operating a memory system, comprising:
    obtaining hard data from memory cells by performing a hard read operation based on a hard read voltage applied to the memory cells;
    estimating a deviation direction indicating whether the hard read voltage is larger or smaller than a reference voltage based on threshold voltage distributions of the memory cells by processing the hard data and oversampling data obtained from the memory cells;
    adjust initial reliability values corresponding to a plurality of threshold voltage intervals based on the deviation direction; and
    performing an error correction operation for the hard data based on adjusted reliability values.

13. The method according to claim 12, wherein:
the oversampling data is obtained by performing an oversampling read operation based on first and second oversampling read voltages applied to the memory cells; and
the oversampling data is obtained as a first value from a memory cell which has a threshold voltage larger than the first oversampling read voltage and smaller than the second oversampling, read voltage, and is obtained as a second value from a memory cell which has a threshold voltage smaller than the first oversampling read voltage or larger than the second oversampling read voltage.

14. The method according to claim 12, wherein:
the oversampling data is obtained by performing an oversampling read operation based on first and second oversampling read voltages applied to the memory cells; and
the first oversampling read voltage is smaller than the hard read voltage by an offset value, and the second oversampling read voltage is larger than the hard read voltage by the offset value.

15. The method according to claim 12, wherein the oversampling data is obtained by performing an oversampling read operation based on first and second oversampling read voltages applied to the memory cells, and the estimating of the deviation direction comprises:
counting memory cells that have threshold voltages larger than the first oversampling read voltage and smaller than the hard read voltage, and generating a counted number as a first estimation value;
counting memory cells that have threshold voltages larger than the hard read voltage and smaller than the second oversampling read voltage, and generating a counted number as a second estimation value; and
estimating the deviation direction by comparing the first estimation value and the second estimation value.

16. The method according to claim 12, further comprising:
obtaining soft data by performing a soft read operation based on a plurality of soft read voltages for the memory cells,
wherein the performing of the error correction operation comprises:
determining a threshold voltage interval where each of the memory cells is positioned, based on the hard data and the soft data;
generating reliability data by allocating an adjusted reliability value corresponding to the threshold voltage interval among the adjusted reliability values, to a corresponding memory cell; and
performing the error correction operation based on the hard data and the reliability data.

17. The method according to claim 16, wherein the threshold voltage intervals are divided by the hard read voltage and the soft read voltages.

18. A memory system comprising:
one or more nonvolatile memory devices including a plurality of memory cells, and operable to apply a hard read voltage to the memory cells to read data based on comparison with threshold voltage distributions of the memory cells;
a controller in communication with the one or more memory devices to control operations performed on the memory cells, the controller configured to:
perform a soft read operation on the memory cells based on a plurality of soft read voltages that subdivides the threshold voltage distributions into a plurality of threshold voltage intervals;
perform an oversampling read operation on the memory cells based on oversampling read voltages;
count a number of memory cells of which the threshold voltages exist between the hard read voltage and oversampling read voltages and compare each counting result to estimate a deviation direction indicating whether the hard read voltage is larger or smaller than a reference voltage;
adjust an initial reliability value allocated to each threshold voltage interval by estimating a current threshold voltage distribution based on a comparing result; and
perform a soft decision decoding operation for the data based on the adjusted reliability value.

19. The memory system according to claim 18, wherein the oversampling read voltages include a first oversampling read voltage lower than the hard read voltage and a second oversampling read voltage higher than the hard read voltage, and wherein counting the number of memory cells of which the threshold voltages exist between the hard read voltage and oversampling read voltages include counting a number of first memory cells of which the threshold voltages exist between the first oversampling read voltage and the hard read voltage and a number of second memory cells of which the threshold voltages exist between the hard read voltage and the second oversampling read voltage.

20. The memory system according to claim 19, wherein estimating the current threshold voltage distribution is performed by comparing the numbers of the first memory cells and the second memory cells.

* * * * *